(12) United States Patent
Xu et al.

(10) Patent No.: US 9,048,009 B2
(45) Date of Patent: Jun. 2, 2015

(54) HIGHLY CONDUCTIVE COMPOSITES

(71) Applicants: Wei Xu, Greenbelt, MD (US); Jun Xu, Greenbelt, MD (US); Zehra Serpil Gonen-Williams, Lanham, MD (US); Gregory D. Cooper, Arlington, VA (US)

(72) Inventors: Wei Xu, Greenbelt, MD (US); Jun Xu, Greenbelt, MD (US); Zehra Serpil Gonen-Williams, Lanham, MD (US); Gregory D. Cooper, Arlington, VA (US)

(73) Assignee: PIXELLIGENT TECHNOLOGIES, LLC, Baltimore, MD (US)

( * ) Notice: Subject to any disclaimer, the term of this patent is extended or adjusted under 35 U.S.C. 154(b) by 0 days.

(21) Appl. No.: 13/682,777

(22) Filed: Nov. 21, 2012

(65) Prior Publication Data

US 2013/0269866 A1    Oct. 17, 2013

Related U.S. Application Data

(62) Division of application No. 12/878,515, filed on Sep. 9, 2010, now Pat. No. 8,344,053.

(60) Provisional application No. 61/241,273, filed on Sep. 10, 2009.

(51) Int. Cl.
| | | |
|---|---|---|
| *B32B 27/00* | (2006.01) |
| *H01B 1/22* | (2006.01) |
| *B01J 19/08* | (2006.01) |
| *B05D 3/12* | (2006.01) |
| *B05D 5/00* | (2006.01) |
| *B05D 3/02* | (2006.01) |
| *B29C 47/00* | (2006.01) |
| *B29C 43/00* | (2006.01) |
| *B29C 45/00* | (2006.01) |
| *C09K 5/00* | (2006.01) |
| *H01B 1/12* | (2006.01) |
| *H05K 3/22* | (2006.01) |
| *H01B 1/24* | (2006.01) |

(52) U.S. Cl.
CPC ............. *H01B 1/22* (2013.01); *Y10T 29/49117* (2015.01); *B01J 19/08* (2013.01); *B05D 3/12* (2013.01); *B05D 5/00* (2013.01); *B05D 3/02* (2013.01); *B29C 47/00* (2013.01); *B29C 43/00* (2013.01); *B29C 45/00* (2013.01); *C09K 5/00* (2013.01); *H01B 1/12* (2013.01); *H05K 3/22* (2013.01); *B29C 47/0014* (2013.01); *B29C 47/0016* (2013.01); *H01B 1/24* (2013.01)

(58) Field of Classification Search
USPC .......................................... 524/403
See application file for complete search history.

(56) References Cited

U.S. PATENT DOCUMENTS

| | | | | |
|---|---|---|---|---|
| 4,029,628 | A | * | 6/1977 | Fredberg ....................... 524/361 |
| 4,654,279 | A | | 3/1987 | Bauer et al. |
| 6,791,839 | B2 | | 9/2004 | Bhagwagar |
| 7,030,483 | B2 | * | 4/2006 | Matayabas et al. ........... 257/706 |
| 7,550,097 | B2 | * | 6/2009 | Tonapi et al. ................. 252/512 |
| 8,058,337 | B2 | | 11/2011 | Yadav et al. |
| 2011/0214284 | A1 | | 9/2011 | Xu et al. |

\* cited by examiner

*Primary Examiner* — Hui Chin
(74) *Attorney, Agent, or Firm* — Nixon & Vanderhye P.C.

(57) ABSTRACT

Domain segregation of polymer blends or block copolymers in the presence of thermal conducting high aspect ratio nanocrystals leads to preferential placement of conductive filler either inside one domain, which promote the self-assembly of a thermal and/or electrical conducting pathway composed of high aspect ratio filler. The self-assembly of such thermal and/or electrical conducting pathway effectively enhances the thermal and/or electrical conductivity of the composite with significantly less amount of filler.

36 Claims, 9 Drawing Sheets

HIGHLY CONDUCTIVE COMPOSITES

CROSS-REFERENCES TO RELATED APPLICATIONS

This application is a divisional of application Ser. No. 12/878,515 (now U.S. Pat. No. 8,344,053), filed Sep. 9, 2010, which claims benefit of U.S. Provisional Application No. 61/241,273, filed Sep. 10, 2009, the entire contents of each of which are hereby incorporated by reference.

FIELD

The technology herein relates to conductive composite materials, and more particularly to multi-component domain segregated materials.

BACKGROUND AND SUMMARY

Percolation and Nanocomposites

In a conductive network, the conductivity can be guided by percolation theory. Mathematically, percolation can be described as the following: in an infinite network, there is a path of connected points of infinite length "through" the network. With increasing population of the conducting points, there exists a critical number above which at least one conducting pathway forms within the network. The critical point is called percolation threshold which is a particle-size and geometry-dependent parameter for composites. Generally, smaller particles allow for a lower percolation threshold, due to the fact that average particle distance decreases with particle size, given the same volume ratio, which helps to build the connection pathway of particles through the whole composite. Particle shape is another important factor. It has been shown, both theoretically and experimentally, that percolation threshold can be significantly decreased by using high aspect ratio particles.

Previously fillers with different compositions, surface lubrications, and shapes were used for electrically conductive composites, utilizing fillers such as metal beads, metal fibers, metal flakes and metal coated flakes. Fillers with high aspect ratio were also used in thermally conductive composites.

Heat transfer in composites is similar to that of electrical conduction except that heat is transported by phonons instead of electrons. Nevertheless, similar to electrical conductivity, any given material has a resistivity against heat flow, therefore, the network rule of electrical conductivity applies to thermal conductivity as well.

Applications of Composites

Composites have been and could be applied in several important areas. One area is electronics packaging. Over the past decade, as on chip interconnect dimensions have been reduced, power to drive the more resistive circuits has become more and more problematic. New packaging solutions that do not require liquid cooling are in demand for today's new chips and circuits. The successful development of composites containing high thermal conductivity fillers may ensure that advanced packaging technology is capable of facing the challenges that may be presented by current and future generations of chips and circuits.

Another area where composites could be applied is for use as temporary bonding materials for wafer processing. To accommodate the ever increasing demand for smaller IC devices in cell phones, music players, cameras etc, it has become common to grind the fully processed device wafers to be thinner. After the device wafer is processed on the front side, it is coated with a temporary bonding adhesive on the front and further processed on the back (thinning, etching, metallization, etc.). The device wafer is then detached from the temporary bonding materials. The wafer thinning is often done using aggressive methods that generate a substantial amount of heat, which inevitably raises the wafer temperature, sometimes to as high as 300° C. Better heat dissipation may reduce the device temperature and/or allow for more aggressive thinning methods to reduce processing times. Incorporation of thermal conductive fillers could help to increase the thermal conductivity of the temporary bonding materials. Using traditional conductive fillers to effectively increase the thermal conductivity of the composite typically requires high levels of loading, which significantly decrease the bonding strength of the composites. Therefore, it would be useful to develop a composite with low filler loading and high thermal conductivity for better temporary bonding materials.

A third area where composites can be used is for polymers that are electrically conducting, which can be used in many applications including conducting pastes or adhesives, charge dissipation materials, transparent conductors, and electromagnetic interference shielding (EMI shielding).

Conducting paste or adhesives are often made by mixing conductive filler into adhesive materials and have been widely used in the advanced packaging industry (such as die attach materials to provide mechanical adhesion and electrical conductivity between dies and printed circuit board; or lead-free solder materials to provide electrical interaction between devices) in forms of paste, gel or tape. High electrical conductivity often requires high filler loading. Common fillers used include metal flakes, metal fibers, carbon black or carbon fiber. However, adhesion strength and/or mechanical properties often suffer as a result of high filler loading. Therefore, it is desirable to achieve electrical conductivity using low filler loading.

Transparent conductor materials are required to have a combination of optical transparency and electrical conductivity. Their application can be found in flat panel displays, solar cells, smart windows, photovoltaics, EL lighting and a variety of other optical and electronic applications, where they can deliver or collect electrons from the active part of the device while allowing visible photons to pass through without a significant loss. Transparent conductors for commercial scale need to be processed easily and cost effectively. Indium Tin Oxide (ITO) is the most widely used transparent conductor due to its superior combination of transparency and conductivity. In some applications, fluorine-doped indium oxide (FTO) is used as an alternative to ITO. However, ITO, as well as FTO, is expensive due to the short supply of indium. Moreover, ITO is far from ideal for many of the fastest growing application sectors in which transparent conductors are used. For instance, the inherit brittleness of ITO constrains its application in touch screen displays since it cracks easily. Other transparent electrical conductive film, such as transparent carbon nanotube sheet, while is strong and flexible, is more costly and has not fully entered industrial applications.

Electric charges, induced by contact, pressure, or heat, build up on an object with low electrical conductivity. Rapid discharge of the static charge build up can generate a large electric current or an electrical spark, which may be extremely harmful to electronic devices, around flammable and ignitable materials, and in space exploration. Increasing the surface conductivity of the materials helps to reduce the charge build up and dissipates static charge to the ground constantly.

Electrically conductive materials are also commonly used for EMI shielding. EMI exists when an electromagnetic disturbance induces undesirable voltages or currents that adversely influence the performance of electronics or electrical devices. EMI in radio communications has also been called radio frequency interference (RFI). Currently, certain frequency ranges are prohibited or rigorously regulated by the government and/or the military. The greatest concern about EMI besides communications is its effect on electronic devices such as onboard sensor systems, pacemakers, electrosurgical units and personal computers. Electromagnetic interference works in different ways to degrade the performance of an electronic device. The most common form of interference is the electrical current generated in an electrical circuit, when it is hit by an electromagnetic disturbance. Depending upon the magnitude of the electrical disturbance, the induced electrical current can either corrupt a low level signal or override and eventually destroy the circuit.

Materials with high electrical conductivity often have high thermal conductivity as well. However, in an application such as an electric-thermal heating unit, materials with high electrical conductivity and low thermal conductivity are needed. Materials are needed in the form of bulk, fibers, and films. Some other properties, such as transparency, thermal fatigue tolerance, and toughness need to be optimized as well.

Example material compositions and processing methods disclosed herein provide domain segregation of blends of polymers or polymer and small molecule compounds, and/or block copolymers useful to generate a thermally and/or electrically conductive pathway composed of thermal and/or electrical conducting fillers.

Composite materials conduct heat and/or electricity through pathways constructed through domain segregation of polymer blends and/or block copolymers. The matrix polymers provide mechanical strength to the composite and necessary binding properties. They also provide confinement to the second phase materials, preferably with low melting points or low softening temperatures. Thermal/electrical conductive fillers are purposely and preferentially dispersed in the second phase material domains. At the operating temperature, the second phase materials tend to swell, melt and/or flow and the conductive fillers, such as highly mobile particles can align to form an effective thermal/electrical conducting pathway.

An example non limiting implementation provides a multi-component material for thermal conduction, comprising, a first component comprising a matrix polymer, a second component comprising a low melting point material immiscible with the first component, and a third component comprising a filler material with higher thermal conductivity than the first and second components. Wherein the third component is dispersed into the second component and the second component is dispersed within the polymer matrix.

An example non limiting implementation provides a process of making a multi-component fluid for use in manufacturing thermally enhanced layers. This multi-component fluid comprising a polymeric matrix material, a low melting point material and filler particles. The process comprising capping filler particles with capping agents immiscible with the polymeric matrix material and miscible in the low melting point material, dispersing capped filler particles in the low melting point material and creating a mixture by combining the polymeric matrix and the low melting point material including the dispersed capped filler particles.

An example non limiting implementation provides a product formed by the process of making a multi-component fluid. This multi-component fluid comprising a polymeric matrix material, a low melting point material and filler particles. The process comprising capping filler particles with capping agents immiscible with the polymeric matrix material and miscible in the low melting point material, dispersing capped filler particles in the low melting point material and creating a mixture by combining the polymeric matrix and the low melting point material including the dispersed capped filler particles.

An example non limiting implementation provides a process for assembling a system having enhanced thermal conductivity. This system comprising an integrated circuit, a heat sink, and a multi-component composite material. The process comprising forming a multi-component composite thermal conductor between the integrated circuit and the heat sink. The multi-component thermal conductor comprises a matrix material and a second phase material with high thermal conductive filler material.

An example non limiting implementation provides a multi-component electrical conductor with a first component that is a matrix polymer, a second component that is a low melting point material immiscible with the first component; and a third component that is a filler material with higher electrical conductivity than the first and second components. The third component is dispersed into the second component and the second component is dispersed within the polymer matrix. The third component provides enhanced electrical conductivity to the multi-component electrical conductor. In addition an example multi-component electrical conductor may comprise an optically transparent first component and an optically transparent second phase material and a third component that is a filler material with higher electrical conductivity than the first and second components. The refractive indices of the polymer matrix and the second phase material may be similar to each other to minimize internal reflection and maximize transparency.

One exemplary non-limiting illustrative embodiment provides a composite composition made up of multiple components. The multiple component system include, at least two components, preferably three components, and more components in certain applications. This multiple component system includes polymers and fillers to improve the thermal and/or electrical conductivity of the matrix material in at least one dimension.

One exemplary non-limiting illustrative embodiment provides matrix material that is thermoplastic. Examples include, but are not limited to, poly(acrylonitrile-butadiene-styrene) (ABS), poly(methyl methacrylate) (PMMA), celluloid, cellulose acetate, poly(ethylene-vinyl acetate) (EVA), poly(ethylene vinyl alcohol) (EVOH), fluoroplastics, polyacrylates (Acrylic), polyacrylonitrile (PAN), polyamide (PA or Nylon), polyimide-imide (PAT), polyaryletherketone (PAEK), polybutadiene (PBD), polybutylene (PB), polybutylene terephthalate (PBT), polycaprolactone (PCL), polychlorotrifluoroethylene (PCTFE), polyethylene terephthalate (PET), polycyclohexylene dimethylene terephthalate (PCT), polycarbonate (PC), polyhydroxyalkanoates (PHAs), polyketone (PK), polyester, polyethylene (PE), polyetheretherketone (PEEK), polyetherketoneketone (PEKK), polyetherimide (PEI), polyethersulfone (PES), polyethylenechlorinates (PEC), polyimide (PI), polylactic acid (PLA), polymethylpentene (PMP), polyphenylene oxide (PPO), polyphenylene sulfide (PPS), polyphthalamide (PPA), polypropylene (PP), polystyrene (PS), polysulfone (PSU), polytrimethylene terephthalate (PTT), polyurethane (PU), polyvinyl acetate (PVA), polyvinyl chloride (PVC), polyvinylidene chloride (PVDC), poly(styrene-acrylonitrile) (SAN), etc.

One exemplary non-limiting illustrative embodiment provides matrix material that is a rubber. Examples include, but are not limited to, silicon rubber, fluorinated silicone rubber, natural rubber, vulcanized rubber, nitrite rubber, styrene butadiene rubber, ethylene propylene diene rubber, neoprene, polyisoprene, polybutadiene, butyl rubber, urethane rubber, hypalon polyethylene, polyacrylate rubber, epichlorohydrin, fluoro carbon rubber, hydrogenate nitrile, etc.

One exemplary non-limiting illustrative embodiment provides matrix material that is thermosetting polymer. Examples include, but are not limited to, epoxy resin, phenolic resin, unsaturated polyester, melamine resin, urea-formaldehyde, etc.

One exemplary non-limiting illustrative embodiment provides having second phase material being a polymer material with melting point, or softening point, or flow point lower than the operating temperature. Examples of a second phase material include, but are not limited to, poly(acrylonitrile-butadiene-styrene) (ABS), poly(methyl methacrylate) (PMMA), celluloid, cellulose acetate, poly(ethylene-vinyl acetate) (EVA), poly(ethylene vinyl alcohol) (EVOH), fluoroplastics, polyacrylates (Acrylic), polyacrylonitrile (PAN), polyamide (PA or Nylon), polyamide-imide (PAI), polyaryletherketone (PAEK), polybutadiene (PBD), polybutylene (PB), polybutylene terephthalate (PBT), polycaprolactone (PCL), polychlorotrifluoroethylene (PCTFE), polyethylene terephthalate (PET), polycyclohexylene dimethylene terephthalate (PCT), polycarbonate (PC), polyhydroxyalkanoates (PHAs), polyketone (PK), polyester, polyethylene (PE), polyetheretherketone (PEEK), polyetherketoneketone (PEKK), polyetherimide (PEI), polyethersulfone (PES), polyethylenechlorinates (PEC), polyimide (PI), polylactic acid (PLA), polymethylpentene (PMP), polyphenylene oxide (PPO), polyphenylene sulfide (PPS), polyphthalamide (PPA), polypropylene (PP), polystyrene (PS), polysulfone (PSU), polytrimethylene terephthalate (PTT), polyurethane (PU), polyvinyl acetate (PVA), polyvinyl chloride (PVC), polyvinylidene chloride (PVDC), poly(styrene-acrylonitrile) (SAN), etc.

One exemplary non-limiting illustrative embodiment provides second phase material that is a small organic or inorganic molecule or an oligomer with melting point lower than the operating temperature. Examples include, but are not limited to, paraffin ($C_lH_{2n+2}$), fatty acids ($CH_3(CH_2)_{2n}COOH$), alkylamines ($CH_3(CH_2)_{2n}NH_2$), salt hydrates ($M_nH_2O$), (where M refers to a metal), etc.

One exemplary non-limiting illustrative embodiment provides having the same material as the polymer matrix and the second phase polymer. This multiple component system only has two components with component A being the matrix and component C being the conductive filler.

One exemplary non-limiting illustrative embodiment provides fillers with low aspect ratio. Examples include, but are not limited to, C, Si, Ge, Ag, Au, Cu, Ni, Pt, Pd, Fe, Pb, Al, Zn, Co, Dy, Gd, CuCl, CuBr, CuI, AgCl, AgBr, AgI, $Ag_2S$, $Al_2O_3$, $Ga_2O_3$, $In_2O_3$, FeO, $Fe_2O_3$, $Fe_3O_4$, $TiO_2$, MgO, $Eu_2O_3$, $CrO_2$, CaO, MgO, ZnO, $Mg_xZn_{1-x}O$, $SiO_2$, $Cu_2O$, $Zr_2O_3$, $ZrO_2$, $SnO_2$, ZnS, HgS, $Fe_2S$, $Cu_2S$, $CuIn_2S_2$, $MoS_2$, $In_2S_3$, $Bi_2S_3$, GaP, GaAs, GaSb, InP, InAs, $In_xGa_{1-x}As$, SiC, $CaF_2$, $YF_3$, $YSi_2$, $GaInP_2$, $Cd_3P_2$, $CuIn_2Se_2$, $In_2Se_3$, $HgI_2$, $PbI_2$, ZnSe, CdS, CdSe, CdTe, HgTe, PbS, BN, AlN, GaN, InN, $Si_3N_4$, ZrN, $Y_2O_3$, $HfO_2$, $Sc_2O_3$, etc.

One exemplary non-limiting illustrative embodiment provides fillers with high aspect ratio. Examples include, but are not limited to, C, Si, Ge, Ag, Au, Cu, Ni, Pt, Pd, Fe, Pb, Al, Zn, Co, Dy, Gd, CuCl, CuBr, CuI, AgCl, AgBr, AgI, $Ag_2S$, $Al_2O_3$, $Ga_2O_3$, $In_2O_3$, FeO, $Fe_2O_3$, $Fe_3O_4$, $TiO_2$, MgO, $Eu_2O_3$, $CrO_2$, CaO, MgO, ZnO, $Mg_xZn_{1-x}O$, $SiO_2$, $Cu_2O$, $Zr_2O_3$, $ZrO_2$, $SnO_2$, ZnS, HgS, $Fe_2S$, $Cu_2S$, $CuIn_2S_2$, $MoS_2$, $In_2S_3$, $Bi_2S_3$, GaP GaAs, GaSb, InP, InAs, $In_xGa_{1-x}As$, SiC, $CaF_2$, $YF_3$, $YSi_2$, $GaInP_2$, $Cd_3P_2$, $CuIn_2Se_2$, $In_2Se_3$, $HgI_2$, $PbI_2$, ZnSe, CdS, CdSe, CdTe, HgTe, PbS, BN, AlN, GaN, InN, $Al_xGa_{1-x}N$, $Si_3N_4$, ZrN, $Y_2O_3$, $HfO_2$, $Sc_2O_3$, layered silicate clays, talc, layered perovskites, etc.

Another exemplary non-limiting illustrative embodiment provides a multiple component composite system with two polymers and two fillers. The second filler can either be a conductive filler to further enhance the thermal and/or electrical conductivity of the composite or mechanical reinforcing filler which provides extra physical strength to the composites. Example of the second filler include, but are not limited to, alkyltrimethylsilane capped silica colloids preferentially entering the matrix material (component A) as thermally conductive filler, alkylphosphoric acid capped carbon nanotubes preferentially entering the matrix material (component A) as thermal and/or electrical conductive filler and mechanical reinforcing filler.

One exemplary non-limiting illustrative embodiment provides methods for applying the composite. The methods include, but are not limited to, curing, polymerization, laminating, extrusion, injection molding, mold casting, spin coating, dip coating, brushing, spraying, printing, etc.

One exemplary non-limiting illustrative embodiment provides having a high aspect ratio filler chemically bonded with the low melting point polymer that is in-situ polymerized. The chemical bonds promote the alignment of the high aspect ratio fillers as the low melting point polymer melt and flow at the working temperature.

BRIEF DESCRIPTION OF THE DRAWINGS

These and other features and advantages will be better and more completely understood by referring to the following detailed description of non-limiting example illustrative embodiments in conjunction with the drawings, of which.

DETAILED DESCRIPTION OF NON-LIMITING ILLUSTRATIVE EMBODIMENTS

Multiple Component System

Figure 1:
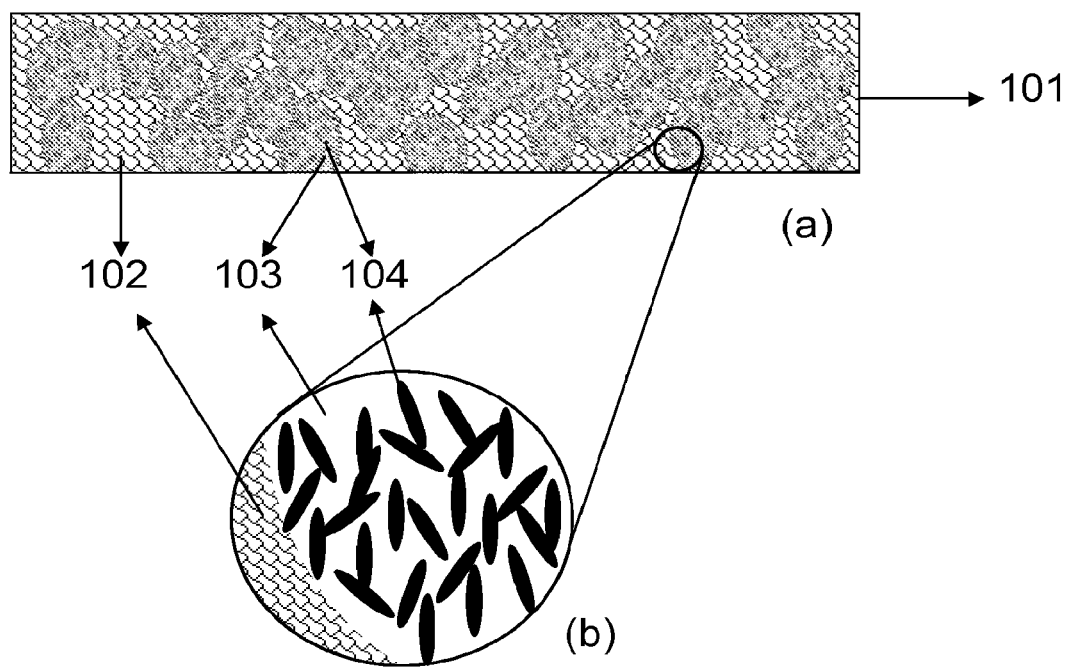
FIG. 1a shows an exemplary illustrative non-limiting multiple component composite material.
FIG. 1b is a close up of an exemplary multiple component material showing the phase segregated materials and fillers in one phase.

One exemplary non-limiting illustrative embodiment provides a two phase polymer material with at least one type, shape or phase of filler in at least one polymer phase. One phase of polymer is the matrix material (Component A) and the other phase of the polymer is a low melting material (Component B) or low softening temperature material. The matrix material can be either a thermosetting polymer, or a thermoplastic polymer, or a rubbery material which provides the required mechanical properties and necessary binding properties of the composites. The segregated second phase material could be, but not limited to, a polymeric material with relatively low melting point depending on the desired working temperature (melting point lower than the working temperature). This segregated domain flows above its melting temperature to fill up any air gaps at the interface between the composite and the substrate to ensure the maximum contact area. The filler (Component C) can be micro-sized particles, or preferably sub-micron sized particles or more preferably nanoparticles, or even more preferably high aspect ratio nanoparticles.

An exemplary composite film (101) is shown in FIG. 1a. A polymer blend made with two immiscible materials (102 and 103) can phase segregate into micron or submicron sized domains. One phase of the blend can be a polymer matrix material (102) and the other phase can be a low melting point material (103). High aspect ratio fillers (104) can be placed in the low melting point phase. They may only be present in this phase. And due to geometrical confinement effect (the length of particles may be bigger than the width of the domain), the particles may be preferentially aligned. FIG. 1b shows the blow up of the region where the first phase (102) and the second phase (103) materials are segregated and the fillers (104) are in the second phase material.

One exemplary non-limiting illustrative embodiment provides that the fillers selectively enter into the low melting point polymer domain by choosing appropriate surface passivation agents. This effectively reduces the percolation threshold of the composite since percolation is only needed in the domains instead of in the whole composite, since the second phase domain is populated enough to form percolation for the whole composite.

One exemplary non-limiting illustrative embodiment provides an immiscible polymer blend with segregated domain size in the range between several hundred nanometers and several micrometers. The morphology and the size of the domains are controlled by the composition of the polymers, the physical properties of the polymers and the processing condition of the blend.

Figure 2:
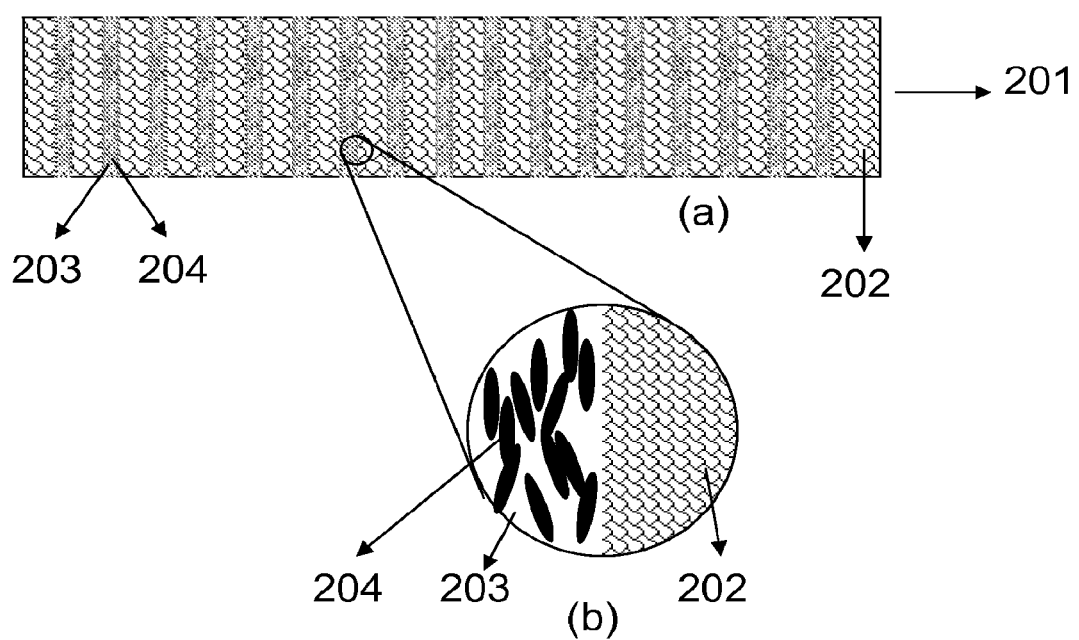
FIG. 2a shows an exemplary illustrative non-limiting multiple component composite material.
FIG. 2b is a close up of an exemplary multiple component material showing the phase segregated block co-polymers and fillers in one of the phases.

The various components of the composites serve different purposes. Component A, or the polymer matrix, accounts for majority of the volume of the composite, preferably 50-65%. The polymer matrix can be a thermoset, a thermoplastic or a rubber. It binds the composite to the heat generating electronic components (die) on one side and the heat dissipating block (heatsink) on the other side as illustrated in FIGS. 1 and 2. Component A, as the dominant component in the composites, contributes the most to the physical properties of the composite. Component A may yield the worst conductivity by itself, if it is not filled with conductive fillers. One example of thermoset matrix polymer is epoxy, one example of thermalplastic matrix polymer is polyimide, and one example of rubber matrix polymer is silicon rubber, which have thermal conductivities of approximately 0.18 W/m·K, 0.52 W/m·K, and 0.22 W/m·K, respectively.

Component B can be a polymer material that has a low melting point or low softening temperature. It may account for less than 50% of the volume of the composites, preferably 10-45%, more preferably 15-35%. It tends to swell, soften, and/or melt upon heating at the operating temperature. One advantage of using low melting point or low softening point materials as the second phase is to eliminate any air gap between the composite and the substrates (die and heatsink), while the matrix polymer may not be able to undergo any further major physical deformation to conform to the rough substrate. A melted or softened second phase may also facilitate the motion of the filler so that they can easily align along the preferred direction.

One exemplary non-limiting illustrative embodiment provides examples of low melting point polymers with adjustable melting points. These examples include, but are not limited to, polyethylene oxide (PEO) and poly(ε-caprolacton) (PCL). Polyethylene oxide with molecular weight lower than 20,000 is commonly referred to as polyethylene glycol (PEG). The melting point of PEO is around 70° C. Reducing the molecular weight of PEO and turning it into oligomers can drop the melting point to below room temperature. Therefore, by choosing the molecular weight of the PEO or oligo-PEG, the operating temperature of the composites can be varied to span temperature range from room temperature to 70° C. For other operating temperature, polymers with appropriate melting points can be chosen accordingly. The choice of melting point or softening point defines the operation temperature of the composite. Furthermore, Component B can also be chosen from a series of low melting point non-polymeric materials (such as stearic acid) or oligomer materials.

Another exemplary composite material (201) is shown in FIG. 2a. A polymer matrix material (202) and a second phase material (203) can be chemically bonded to each other as a block co-polymer. One chain segment of the block co-polymer can have a lower melting point than the other chain segment. The segment of the block co-polymer with a lower melting point can be the second phase material (203). The block co-polymer can self assemble into a two phase system and the low melting point phase can be segregated into micron or submicron sized domains. These micron or submicron size domains can be aligned in the desired direction. The domain size of block copolymer can be in the range between 10 to 50 nm. High aspect ratio fillers (204) can enter into the low melting point phase and due to geometrical confinement effect (the length of particles may be bigger than the width of the domain) they align in the same direction as the domains of the second phase. FIG. 2b shows the blow up of the region where the first phase (202) and the second phase (203) materials of the block co-polymer are segregated and the fillers (204) are in the second phase (203) material.

Another exemplary non-limiting illustrative embodiment provides having a polymer matrix and a second phase polymer chemically bonded to each other as a block copolymer. Examples of block copolymers include, but are not limited to, polymethylmethyacrylate-b-polyethylene oxide (PMMA-b-PEO), polystyrene-b-ethylene oxide (PS-b-PEO), poly(dimethyl siloxane-b-adipic anhydride) (PDMS-b-PAA), poly(methyl methacrylate-b-vinyl pyridine) (PMMA-b-PVP), Poly (vinyl naphthalene-b-t-butyl acrylate) (PVN-b-PBA), polydimethylsiloxane-b-ethylene oxide (PDMS-b-PEO), poly(dimethylsiloxane-b-ε-caprolactone) (PDMS-b-PCL), etc. More preferably, the matrix can be a block copolymer with one block being the high temperature resistant polymer and the second block being the low melting point polymer. Examples include, but are not limited to, polydimethylsiloxane-b-ethylene oxide (PDMS-b-PEO), poly(dimethylsiloxane-b-ε-caprolactone) (PDMS-b-PCL), poly(urethane-b-dimethylsiloxane).

Component C is a microsized or nanosized and preferably high aspect ratio conductive filler. The filler has a high thermal and/or electrical conductivity. It only accounts for 1-49%, preferably 2-15% of the volume of the composite. Low filler loading assures the minimum impact of filler on the morphology of the domain segregation of the polymer blend or block copolymer. More importantly, the low filler loading can substantially decrease the degradation of the adhesion property of the materials by large filler loading that is otherwise used to provide the desired higher conductivity. As discussed in the background, high aspect ratio filler lowers the percolation threshold of the composite. In another word, less filler may be needed to provide a conducting pathway through the composite. By making the fillers incompatible with the matrix polymer and compatible with the low melting point polymer/oligomer, fillers enter into the low melting point polymer/oligomer phase only and lower the percolation threshold even more as illustrated in FIG. 1 and FIG. 2. This may be accomplished by choosing the passivating agents on the fillers such that they are compatible with the low melting point polymer/oligomer phase. One example of the conductive filler is silver nanowires that can be synthesized in large quantities with a diameter of 50 nm and the length of 8 μm. The surface of the nanowires can be passivated with Polyvinylpyrrolidone (PVP). Subsequent surface modification with thiol terminated polyethylene oxide provides the compatibility of the nanowires when the second phase, i.e. low melting point polymer phase, is chosen to be polyethylene oxide.

The selection of the dimension of the filler needs to be based on the domain size and domain morphology of the polymer blends and block copolymers. In most of the situations, cylindrical shape with high aspect ratio (the ratio of length/diameter) may be preferable. High aspect ratio significantly reduces the critical concentration needed to form a conduction pathway in the composite. The diameter of the fillers needs to be very small compared with the domain size so that the presence of the filler does not significantly interfere with the domain segregation behavior. The length of the filler should to be similar to the domain size on the lateral direction to maximize the geometrical confinement effect. With filler length approaching the domain size, the long axis of the filler may preferentially align with the long axis of the polymer domain. As a result, the fillers align along the heat transfer direction as illustrated in FIG. 1 and FIG. 2, which further reduces the percolation threshold.

The fillers are placed preferentially into the low melting point phase because the alignment of the filler can proceed much easier in a melted or softened material phase with reduced viscosity. The flow of molten polymer to conform to the substrate may also bring the heat conducting fillers to the interface to provide heat and/or electrical conduction directly toward the substrate.

Another exemplary non-limiting illustrative embodiment provides a composite system with a ceramic matrix material. One example includes filling anodized porous $Al_2O_3$ (matrix material), which has straight channels with diameter between 20 nm and 500 nm, with polystyrene as the second phase. Polystyrene has a melting point of 240° C. And the filler can be polystyrene capped AlN nanorods.

Example Non-Limiting Processing and Fabrication Methods

Each component of the composite can be homogenized, using different methods, before they can be made into a composite material suitable for different applications with desired morphology. Fillers are generally compatible with the phase which they preferentially enter.

One exemplary non-limiting illustrative embodiment provides a method of providing dispersability of fillers in composites. Fillers can be capped with surfactant molecules or functionalized polymers for this purpose. Examples of the surfactant molecules include, but are not limited to, alkylsilanes, alkylthiols, alkylamines, alkylcarboxylic acids, alkylphosphoric acids, alkylphosphine oxides, alkylphosphines, alkylammonium salts, etc. Examples of the functionalized polymers include, but are not limited to, polyols, polyacrylic acids, polyacrylic amines, thiol-terminated polymers, silane-terminated polymers, amine-terminated polymers, carboxylic acid-terminated polymers, etc. The surfactant molecules or the functionalized polymers can be compatible with the second phase material. Examples include, but are not limited to, thiol-terminated poly(ε-caprolactone) when poly(ε-caprolactone) is used as second phase material, etc.

One exemplary non-limiting illustrative embodiment provides a method to homogenize the composite. The capped filler is first mixed with melted second phase material. The homogeneous mixture of filler with the second phase material is then mixed with the matrix material. The mixing methods include, but are not limited to, stirring, high shear blending, extruding, homogenizing, ball-milling, sonication, three-roll-milling, in-situ polymerization, solvent blending, etc.

One exemplary non-limiting illustrative embodiment provides a method of providing dispersability of fillers in composites. Fillers can be first mixed or chemically bonded with the monomer of the second phase polymers, followed by in-situ polymerization of the second phase polymer. The formed filler/second phase polymer composite is then mixed with the matrix material. The mixing methods include, but are not limited to, stirring, high shear blending, extruding, homogenizing, ball-milling, sonication, three-roll-milling, in-situ polymerization, solvent blending, etc.

After the composite is homogenized, it can be made into a form suitable for different applications.

Another exemplary non-limiting illustrative embodiment provides a method for forming a film from a multiple component system wherein the melting point of the second phase material starts out higher than the melting point of the matrix material. Fillers are first dispersed in the second phase material by solvent blending, followed by the formation of micro size spheres or ovals of the filler/second phase material composite. These spheres or ovals can be covered with a shell of the matrix material. The mixture is applied to a surface and heated above the melting point of the matrix material but below the melting point of the second phase material in order to maintain the integrity of the second phase. The matrix material melts and flows from the surface of filler loaded second phase material and forms the matrix. Then the chemical structure of the matrix material can be modified to increase its melting point. For example UV light can be applied to the film to crosslink the matrix material and increase the melting point above the melting point of the second phase material. This method provides an innovative route to obtaining the desired second phase domain structure within the matrix material.

Figure 3:
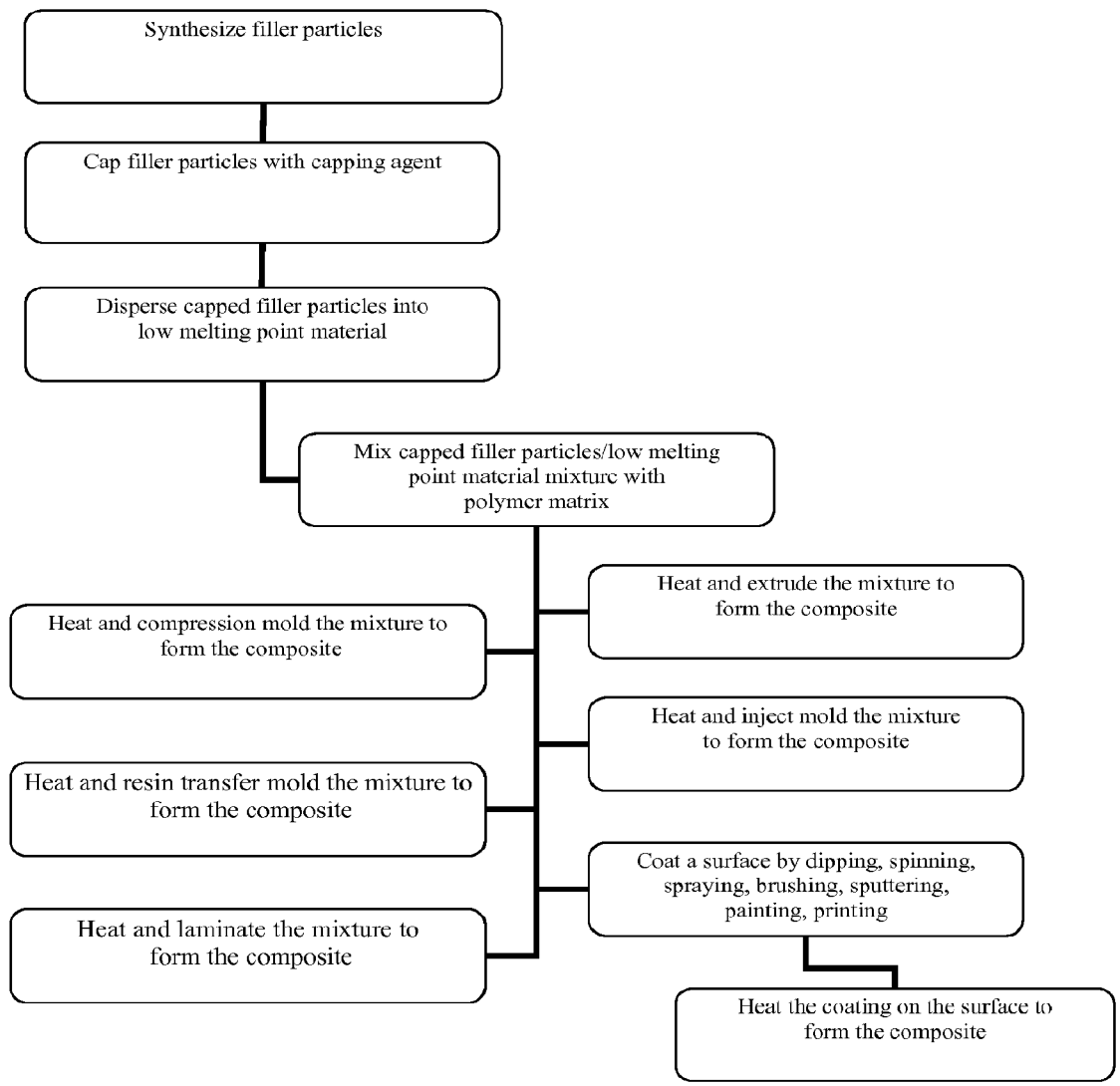
FIG. 3 is a flow chart showing an exemplary illustrative non-limiting process flow to prepare a multiple component composite

FIG. 3 shows an exemplary process flow for preparing a multiple component composite. The process starts with the synthesis of filler particles. The filler particle can then be capped with desired capping agents to provide compatibility between filler particles and low melting point second phase material. Following that, the capped filler particle is blended with the low melting point second phase materials and the mixture is then mixed with matrix material and homogenized. The forming of the composite can be achieved in several processes. One exemplary process may be to heat the composite mixture and extrude it into its final form. Another exemplary process may be to heat the composite mixture and inject mold it into its final form. One other exemplary process may be to heat the composite mixture and compression mold, resin transfer mold or laminate the composite into its final form. The other exemplary process may be to coat a surface with the composite mixture by dipping, spinning, spraying, brushing, sputtering, painting, or printing. The coating is then heated into its final form.

Example Non-Limiting Filler Alignment Methods (Methods to Induce Alignment of Fillers at Desired Direction)

Aligning the conductive fillers, preferentially high aspect ratio fillers, significantly decrease the percolation threshold. As a result, the effective filler loading needed to achieve desired conductivity is decreased.

One exemplary non-limiting illustrative embodiment provides having a high aspect ratio filler in the low melting point polymer domain. The micro and nano-sized domains promote alignment of the high aspect ratio fillers along the heat conducting direction due to geometrical confinement effect. Preferably, the longer dimension of the high aspect ratio filler is similar to the longer dimension of the conducting pathway formed by the low melting point polymer domain. The longer dimension of the high aspect ratio filler can be longer than the shorter dimension of the conducting pathway formed by the low melting point polymer.

Another exemplary non-limiting illustrative embodiment provides the mechanism to align the fillers along designed conducting direction under the influence of an external field. Conductive filler can respond to an external electrical and/or magnetic field. When the second domain is mobile, either during processing or during operating, the high aspect ratio filler can be aligned in desired direction by applying an electrical field or magnetic field along the conduction direction.

One exemplary non-limiting illustrative embodiment provides a mechanism to fix the alignment of the high aspect ratio filler. During composite processing period, both the matrix material and second phase material are mobile. High aspect ratio filler may be aligned during the process under geometrical confinement, induced by, thermal gradients, electrical fields, or magnetic fields. One example provides the alignment prior to the material being put into operation. Alignment of the high aspect ratio filler is induced during the processing of the material. After the composite is formed, the domain structure can be permanently preserved by reducing the temperature and freezing the second phase.

Example Non-Limiting Application as Thermal Interface Materials

Figure 4:
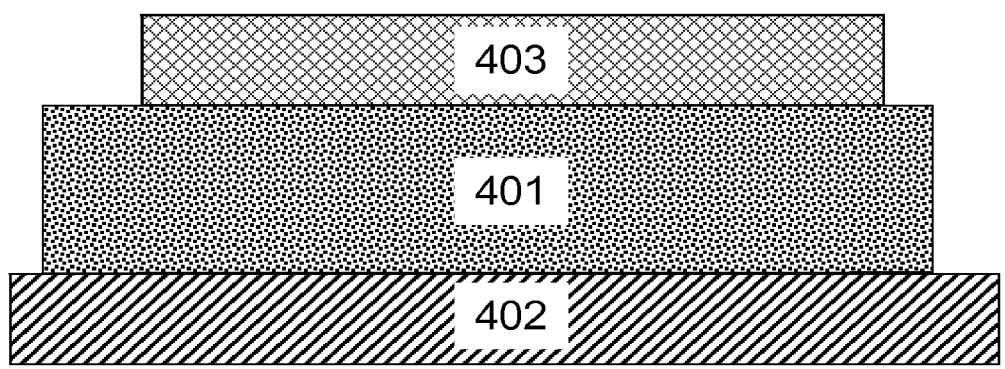
FIG. 4 shows an exemplary non-limiting example thermal interface composite film sandwiched between die and heatsink.

FIG. 4 shows an exemplary thermal interface composite material (401) sandwiched between die (402) and heat sink (403). The thermal interface composite material may be similar to the composite material described in FIG. 1 or FIG. 2. The fillers may align in the direction of heat flow from the die to the heat sink. Thermal interface materials (TIMs) serve as a heat conducting interface between an IC chip and the heat sink. It not only dissipates the excessive amount of heat generated by IC chips toward the heat sink, but also provides mechanical bonding between the IC chips and the heat sink. Traditional TIMs often suffer from low adhesion, low toughness, low tolerance to thermal fatigue and surface roughness, and high hardness due to the high filler loading required to obtain desired thermal conductance. A thermal interface composite material can deliver enhanced thermal conductance with small filler loading. Furthermore, the multi-component thermal interface composite materials can have a reduced coefficient of thermal expansion (CTE) compared to the matrix and the second phase materials. By the incorporation of rigid fillers the CTE of the composite material can be matched to the CTE of the silicon chips. Thermal expansion mismatch typically cause residue stress and thermal fatigue which can significantly decrease the thermal cycling life of the devices.

One exemplary non-limiting illustrative embodiment provides using a multiple component system for thermal management in electronic devices as thermal interface material (TIM). Preferably, a three component system can be used, with component A being at least one thermoset, thermoplastic, or rubber polymer, with component B being at least one low melting point polymer, and with component C being at least one type of conductive filler and conductive filler selectively entering component B. Even more preferably, a four component system can be used, with component A being at least one thermoset, thermoplastic, or rubber polymer, with component B being at least one low melting point polymer, with component C being at least one type of conductive filler that selectively enters into component B, and with component D being the same or different type of conductive filler.

An advantage of example non-limiting embodiments herein compared with traditional thermal interface materials (TIMs) is the utilization of significantly reduced filler loading. Traditionally TIMs often suffer from low adhesion strength, low toughness, low tolerance to thermal fatigue and surface roughness, and high hardness. A three (or more) component system reduces the above mentioned problems by reduced filler loading. Other advantages may include, but are not limited to, high optical transparency, improved processability, improved thermal fatigue tolerance, and improved mechanical fatigue tolerance.

One exemplary non-limiting illustrative embodiment provides a thermoplastic matrix material for TIM application. The thermoplastic is heat resistant with a softening temperature higher than the operating temperature. Examples include, but are not limited to, poly(acrylonitrile-butadiene-styrene) (ABS), fluoroplastics, polyamide (PA or Nylon), polyamide-imide (PAI), polyetheretherketone (PEEK), polyurethane (PU), polyvinyl chloride (PVC), etc.

One exemplary non-limiting illustrative embodiment provides a rubber matrix material for TIM application. The rubber is heat resistant with softening temperature higher than the operating temperature. Examples include, but are not limited to, silicon rubber, fluorinated silicone rubber, vulcanized rubber, fluoro-carbon rubber, etc.

One exemplary non-limiting illustrative embodiment provides thermoset matrix material for TIM application. More preferably, the thermoset is heat resistant with softening temperature higher than the operating temperature. Examples include, but are not limited to, epoxy resin, phenolic resin, urea-formaldehyde, etc.

One exemplary non-limiting illustrative embodiment provides having a second phase material in the matrix material for TIM application. More preferably, the second phase material is immiscible with the matrix material. Example systems include, but are not limited to, polyethylene oxide for epoxy resin matrix, poly($\epsilon$-carprolactone) for silicon rubber, etc.

One exemplary non-limiting illustrative embodiment provides a block copolymer matrix material for TIM application. More preferably, the matrix can be a block copolymer with one block being the high temperature resistant polymer and the second block being the low melting point polymer. Examples include, but are not limited to, polydimethylsiloxane-b-ethylene oxide (PDMS-b-PEO), Poly(dimethylsiloxane-b-ε-caprolactone) (PDMS-b-PCL), poly(urethane-b-dimethylsiloxane).

One exemplary non-limiting illustrative embodiment provides fillers with low aspect ratio for TIM application. More preferably, fillers with high thermal conductivity can be used. Examples include, but are not limited to, C, Ag, Au, Cu, Ni, Pt, Pd, Fe, Pb, Al, Zn, Co, Dy, Gd, ZnO, $SiO_2$, BN, AlN, GaN, $Al_xGa_{1-x}N$, $Al_2O_3$, FeO, $Fe_2O_3$, $Fe_3O_4$, $TiO_2$, MgO, EuO, $CrO_2$, $Y_2O_3$, $HfO_2$, etc.

One exemplary non-limiting illustrative embodiment provides fillers with high aspect ratio for TIM application. More preferably, fillers with high thermal conductivity can be used. Examples include, but are not limited to, C, Ag, Au, Cu, Ni, Pt, Pd, Fe, Pb, Al, Zn, Co, Dy, Gd, ZnO, $SiO_2$, BN, AlN, GaN, $Al_xGa_{1-x}N$, $Al_2O_3$, FeO, $Fe_2O_3$, $Fe_3O_4$, $TiO_2$, MgO, EuO, $CrO_2$, $Y_2O_3$, $HfO_2$, layered silicate clays, talc, layered perovskites, etc.

Thermally conductive fillers can be capped and mixed into low melting point phase, then is blended with the matrix polymer. One exemplary non-limiting illustrative embodiment provides that ZnO nanorods that are passivated with silane terminated polyethylene oxide. The ZnO nanorods are stirred into polyethylene oxide at temperature above a suitable temperature (e.g. 80° C. or some other suitable temperature) until a transparent mixture is achieved. Epoxy resin is then added to this solution and stirred at a suitable temperature (e.g. 80° C.) to obtain a homogeneous mixture. Curing agent is finally added and stirred at a suitable temperature (e.g. 80° C.) to make the composite material.

The composite is then formed between die and heat sink. One exemplary non-limiting illustrative embodiment provides that the homogenous composite mixture is applied onto the bottom of the heat sink, and the heat sink is pasted onto the die. The device is then cured at a suitable temperature (e.g. 140° C.) for a suitable time (e.g. 8 hr). Another exemplary non-limiting illustrative embodiment provides that the homogenous composite mixture is applied onto the die, and the die is pasted onto the heat sink. The device is then cured.

Figure 5:
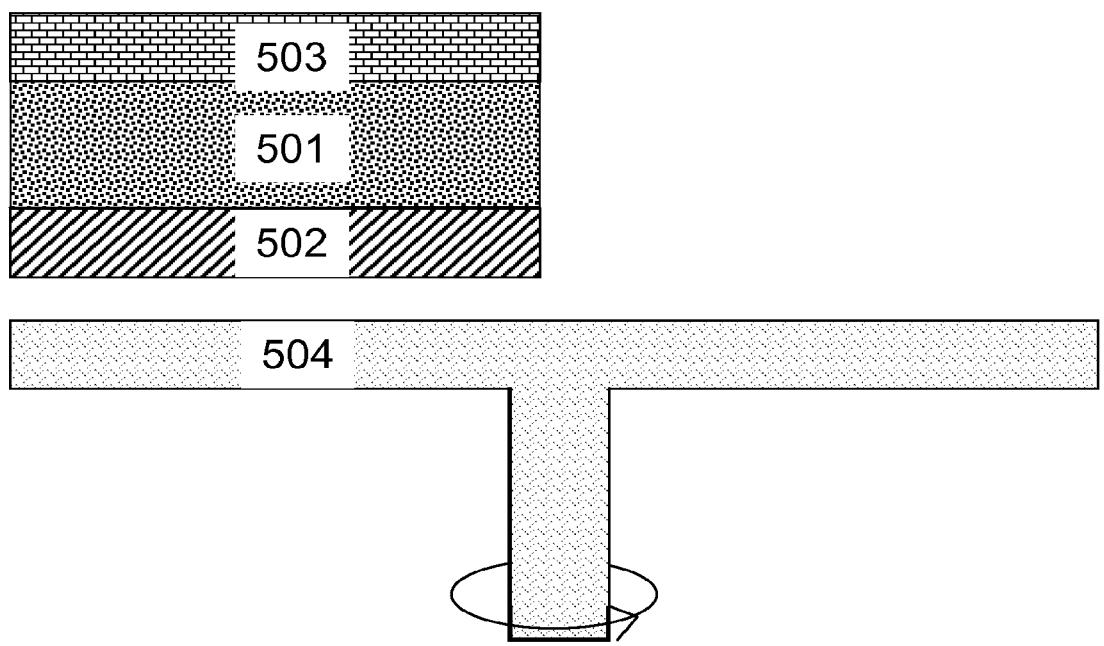
FIG. 5 shows an exemplary non-limiting example temporary bonding material sandwiched between IC chip and positioning chuck and a grinder.

Example Non-Limiting Application as Temporary Bonding Materials for Wafer Processing FIG. 5 shows an exemplary non-limiting multi-component composite material as a temporary bonding material (501). Exemplary temporary bonding material (501) is sandwiched between an IC chip (502) and a positioning chuck (503). The backside of the IC chip (502) can then be ground by a polisher (504). This temporary bonding composite material may be similar to the composite material described in FIG. 1 or FIG. 2. The fillers may align in the direction of heat flow from the IC chip towards the positioning chuck. Temporary wafer bonding materials provide adhesion between the positioning chuck and the front face of a fully processed IC chip. Then the IC chip can be thinned from the back side mechanically. Due to the excessive heat generated by the aggressive grinding process, the IC chip often heats up to as high as 300° C. The temporary bonding materials not only sustain the high operating temperature, they are also ideal materials to provide enhanced heat conductance for effective cooling of the chip. A multi-component composite temporary bonding material can provide the heat conductivity without sacrificing the bonding strength. The glass transition temperature of the polymers can also be favorably increased to allow for higher operating temperature.

One exemplary non-limiting illustrative embodiment provides using a multiple component composite system as temporary bonding materials for water processing. Preferably, a two component system can be used, with component A being at least one of thermoset, thermoplastic, or rubber polymer, and with component C being at least one type of thermally conductive filler. More preferably, three component system can be used, with component A being one of thermoset, thermoplastic, or rubber polymer, with component B being a low melting point polymer or oligomer, and with component C being a thermally conductive filler that selectively enters into component B. Even more preferably, four component system can be used, with component A being one of thermoset, thermoplastic, or rubber polymer, with component B being a low melting point polymer or oligomer, with component C being a thermally conductive filler that selectively enters into component B, and with component D being the same or different type of conductive filler that selectively enters into component A.

One exemplary non-limiting illustrative embodiment provides a multi-component composite system comprising at least one matrix polymer, to be used as temporary bonding materials for water processing. Matrix material may be a thermoplastic, or thermoset, or rubber polymer. More preferably, the matrix material is capable of providing high bonding strength, and high thermal fatigue tolerance. Examples of matrix materials include, but are not limited to, silicone rubber, epoxy resin, phenolic resin, polyimide, unsaturated polyester, etc.

One exemplary non-limiting illustrative embodiment provides a multiple component composite system comprising at least one second polymer, to be used as temporary bonding materials for water processing. Preferably the second polymer has a lower melting point than the operation temperature of the wafer processing. More preferably, the second polymer is immiscible with the matrix material. Examples of a multiple component system include, but are not limited to, polyethylene oxide for epoxy resin matrix, poly(ε-carprolactone) for silicon rubber matrix, etc.

One exemplary non-limiting illustrative embodiment provides a multiple component composite system comprising at least one block copolymer as the matrix polymer, to be used as temporary bonding materials for wafer processing. More preferably, the matrix can be a block copolymer with one block being the high temperature resistant polymer and the second block being the low melting point polymer. Examples of block copolymers include, but are not limited to, polydimethylsiloxane-b-ethylene oxide (PDMS-b-PEO), poly(dimethylsiloxane-b-ε-caprolactone) (PDMS-b-PCL), poly(urethane-b-dimethylsiloxane), etc.

One exemplary non-limiting illustrative embodiment provides a multiple component composite system comprising at least one filler material with low aspect ratio, to be used as temporary bonding materials for water processing. Preferably fillers enter into the second polymer phase. More preferably, fillers with high thermal conductivity can be used. Examples of fillers include, but are not limited to, C, Ag, Au, Cu, Ni, Pt, Pd, Fe, Pb, Al, Zn, Co, Dy, Gd, ZnO, $SiO_2$, BN, AlN, GaN, $Al_xGa_{1-x}N$, $Al_2O_3$, FeO, $Fe_2O_3$, $Fe_3O_4$, $TiO_2$, MgO, EuO, $CrO_2$, $Y_2O_3$, $HfO_2$, etc.

One exemplary non-limiting illustrative embodiment provides a multiple component composite system comprising at least one filler material with high aspect ratio, to be used as temporary bonding materials for water processing. Preferably filler enters into the second polymer phase. More preferably, fillers with high thermal conductivity can be used. Examples of fillers include, but are not limited to, C, Ag, Au, Cu, Ni, Pt, Pd, Fe, Pb, Al, Zn, Co, Dy, Gd, ZnO, $SiO_2$, BN, AlN, GaN, $Al_xGa_{1-x}N$, $Al_2O_3$, FeO, $Fe_2O_3$, $Fe_3O_4$, $TiO_2$, MgO, EuO, $CrO_2$, $Y_2O_3$, $HfO_2$, layered silicate clays, talc, layered perovskites, etc.

Example Non-Limiting Applications as Electrical Conductor

Figure 6:
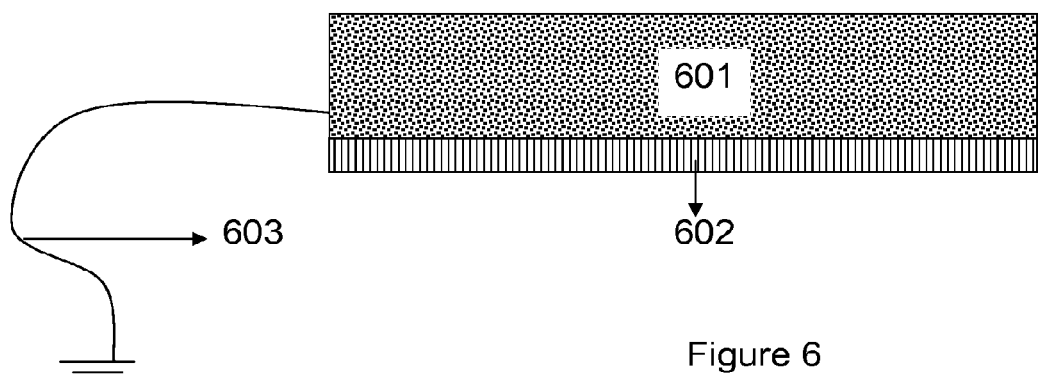
FIG. 6 shows an exemplary non-limiting example charge dissipating composite material coated on a substrate of electronic devices. The charge dissipating material is grounded with a wire(s).

FIG. 6 shows an exemplary non-limiting charge dissipating composite material (601) coated on the electronic device (602). The charge dissipating material is grounded with a wire(s) (603). This charge dissipating composite material may be similar to the composite material described in FIG. 1 or FIG. 2. The fillers may align in the direction parallel to the substrate to maximize the electron conduction toward the grounding wire.

One exemplary non-limiting illustrative embodiment provides the application of electrical conductive composites as conducting paste or adhesive to provide electrical interaction between devices, or between die and printed circuit-board.

One exemplary non-limiting illustrative embodiment provides the application of electrically conductive composites as charge dissipating coating layer. Electrostatic charge builds up on surfaces of electronic devices. Without proper grounding, occasional discharge may happen leading to electrical sparks or unwanted high surface current, which damages the devices. Coating the substrate with electrically conductive materials, as illustrated in FIG. 6, can serve as a charge dissipating layer when they are properly grounded.

Figure 7:
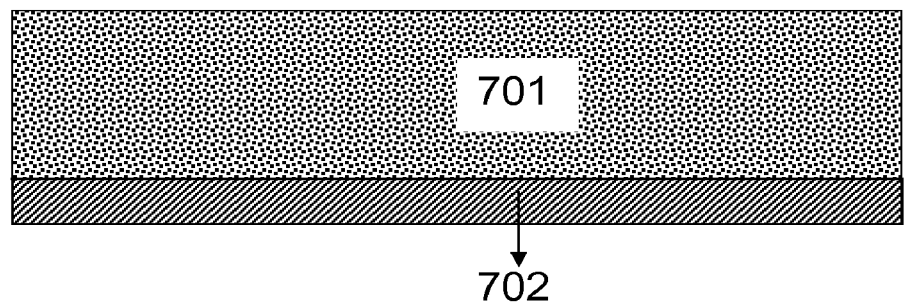
FIG. 7 shows an exemplary non-limiting example electromagnetic interference (EMI) shielding material coated on a substrate of electronic devices.

FIG. 7 shows an exemplary non-limiting electromagnetic interference (EMI) shielding composite material (701) coated on the electronic device (702). This electromagnetic interference (EMI) shielding composite material may be similar to the composite material described in FIG. 1 or FIG. 2.

One exemplary non-limiting illustrative embodiment provides a multiple component composite system to be applied as an EMI shielding material to absorb or reflect unwanted electromagnetic signals to prevent them from entering or leaving the IC devices as illustrated in FIG. 7.

One exemplary non-limiting illustrative embodiment provides using a multiple component composite system as an electrical conductor. Preferably, a three component system can be used, with component A being at least one of thermoset, thermoplastic, or rubber polymer, with component B being a low melting point polymer, and with component C being at least one type of conductive filler that selectively enters into component B. Even more preferably, a four component system can be used, with component A being at least one of thermoset, thermoplastic, or rubber polymer, with component B being a low melting point polymer, with component C being at least one type of electrically conductive filler that selectively enters into component B, and with component D being the same or different type of electrically conductive filler that selectively enters into component A.

One exemplary non-limiting illustrative embodiment provides a multiple component composite system comprising at least one matrix material that is one of thermoplastic, or thermoset or rubber material, for use as an electrical conductor. More preferably, the matrix material is capable of providing mechanical properties and physical properties that can be tailored to match the needs of a variety of different applications. Examples of matrix materials include, but are not limited to, silicone rubber, epoxy resin, phenolic resin, polyimide, unsaturated polyester, etc.

One exemplary non-limiting illustrative embodiment provides a multiple component composite system comprising at least one second phase polymer material, for use as an electrical conductor. More preferably, the second phase polymer is immiscible with the matrix material. Examples of second phase polymers include, but are not limited to, polyethylene oxide for epoxy resin matrix, poly(ε-carprolactone) for silicon rubber, etc.

One exemplary non-limiting illustrative embodiment provides a multiple component composite system comprising at least one block copolymer matrix material, for use as an electrical conductor. More preferably, the matrix can be a block copolymer with one block being the low melting point polymer. Examples include, but are not limited to, polydimethylsiloxane-b-ethylene oxide (PDMS-b-PEO), Poly(dimethylsiloxane-b-ε-caprolactone) (PDMS-b-PCL), poly(urethane-b-dimethylsiloxane).

One exemplary non-limiting illustrative embodiment provides a multiple component composite system comprising at least one filler with low aspect ratio, for use as an electrical conductor. Preferably, filler enters into the second phase material. More preferably, fillers with high electrical conductivity can be used. Examples of fillers include, but are not limited to, C, Ag, Au, Cu, Ni, Pt, Pd, Fe, Pb, Al, Zn, Co, Dy, Gd, etc. Even more preferably, nanoparticle can be used. Example of nanoparticles include, but are not limited to, carbon black nanoparticles, C60 fullerene, gold nanoparticles, silver nanoparticles, etc.

One exemplary non-limiting illustrative embodiment provides a multi-component composite system with at least one filler with high aspect ratio, for use as an electrical conductor. Preferably, filler enters into the second phase material. More preferably, fillers with high electrical conductivity can be used. Examples of fillers include, but are not limited to, C, Ag, Au, Cu, Ni, Pt, Pd, Fe, Pb, Al, Zn, Co, Dy, Gd, etc. Even more preferably, nanowires and nanorods can be used. Examples include, but are not limited to carbon nanotubes, silver nanowires, gold nanorods, etc.

One exemplary non-limiting illustrative embodiment provides a multi-component composite system with at least one filler with high aspect ratio, for use as an electrical conductor. Preferably, filler enters into the matrix material.

Example Non-Limiting Application as Transparent Conductor Materials

One exemplary non-limiting illustrative embodiment provides a multiple component composite system as a transparent conductor material. In this application, transparent polymers can be chosen as the matrix material and the second phase material can be chosen to have a matching refractive index with the matrix material to minimize optical scattering. An exemplary non-limiting illustrative embodiment provides the use of low filler loading to achieve desired electrical conductivity, while maintaining the optical transparency, especially when nano-sized fillers are used.

One exemplary non-limiting illustrative embodiment provides using a multiple component composite system as an electrical conductor. Preferably, a three component system can be used, with component A being at least one of thermoset, thermoplastic, or rubber polymer, with component B being a low melting point polymer, and with component C being at least one type of conductive filler that selectively enters into component B. Even more preferably, a four component system can be used, with component A being at least one of thermoset, thermoplastic, or rubber polymer, with component B being a low melting point polymer, with component C being at least one type of electrically conductive filler that selectively enters into component B, and with component D being the same or different type of electrically conductive filler that selectively enters into component A.

One exemplary non-limiting illustrative embodiment provides a multiple component composite system comprising at least one transparent matrix material that is one of thermoplastic, or thermoset or rubber material, for use as a transparent conductor material. More preferably, the matrix material is capable of providing mechanical properties and physical properties that can be tailored to match the needs of a variety of different applications and has high optical transparency at desired wavelength range. Examples of matrix materials include, but are not limited to, methacrylate polymers, polycarbonate, cyclic olefin polymers, styrenic polymers, fluorine-containing polymers, polyesters, polyethersulfone, polyimides, silicone rubber, epoxy resin, phenolic resin, unsaturated polyester, etc.

One exemplary non-limiting illustrative embodiment provides a multiple component composite system comprising at least one second phase polymer material, for use as transparent conductor materials. More preferably, the second phase polymer is immiscible with the matrix material. Even more preferably, the second phase polymer has a refractive index matching the refractive index of matrix materials (component A). Examples of second phase polymers include, but are not limited to, poly(N-vinyl pyrrolidone) (refractive index 1.53) for epoxy resin matrix (refractive index 1.55); poly(vinyl alcohol) (refractive index 1.50) for polymethyl methacrylate (refractive index 1.49), etc.

One exemplary non-limiting illustrative embodiment provides a multiple component composite system comprising at least one block copolymer matrix material, for use as a charge dissipating material. More preferably, the matrix can be a block copolymer with one block being the low melting point polymer. Small domain size (sub 100 nm) improves the optical transparency. Examples include, but are not limited to, polydimethylsiloxane-b-ethylene oxide (PDMS-b-PEO), Poly(dimethylsiloxane-b-$\epsilon$-caprolactone) (PDMS-b-PCL), poly(urethane-b-dimethylsiloxane).

One exemplary non-limiting illustrative embodiment provides a multiple component composite system comprising at least one filler with low aspect ratio, for use as a transparent conductor material. Preferably, filler enters into the second phase material. More preferably, fillers with high electrical conductivity can be used. Examples of fillers include, but are not limited to, C, Ag, Au, Cu, Ni, Pt, Pd, Fe, Pb, Al, Zn, Co, Dy, Gd, etc. Even more preferably, nanoparticle can be used. Example of nanoparticles include, but are not limited to, carbon black nanoparticles, C60 fullerene, gold nanoparticles, silver nanoparticles, etc.

One exemplary non-limiting illustrative embodiment provides a multi-component composite system with at least one filler with high aspect ratio, for use as a electrical conductor. Preferably, filler enters into the second phase material. More preferably, fillers with high electrical conductivity can be used. Examples of fillers include, but are not limited to, C, Ag, Au, Cu, Ni, Pt, Pd, Fe, Pb, Al, Zn, Co, Dy, Gd, etc. Even more preferably, nanowires and nanorods can be used. Examples include, but are not limited to carbon nanotubes, silver nanowires, gold nanorods, etc.

One exemplary non-limiting illustrative embodiment provides a multi-component composite system with at least one filler with high aspect ratio, for use as a transparent conductor material. Preferably, filler enters into the matrix material.

Example Non-Limiting Application as Electrical-Thermal Heating Materials

Figure 8:
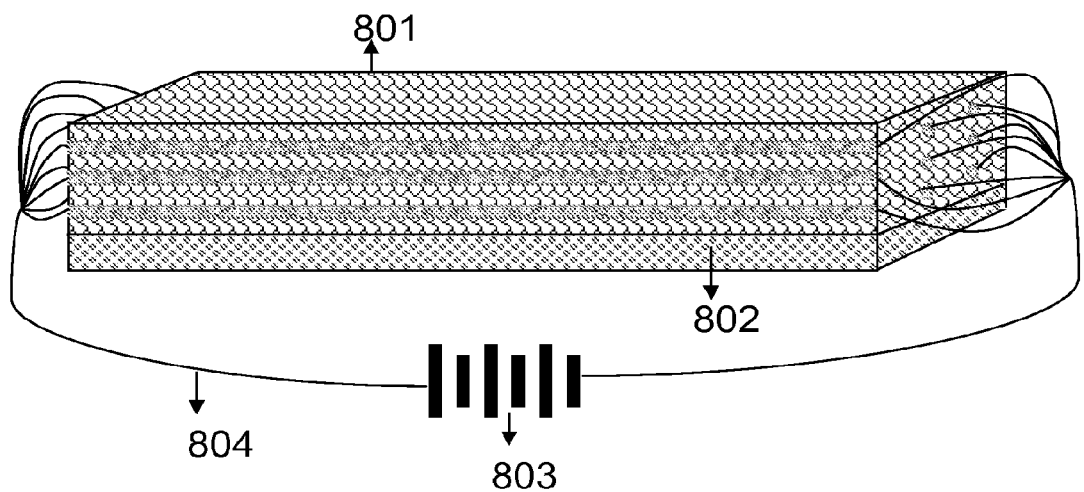
FIG. 8 shows an exemplary non-limiting example electrical-thermal heating film coated on glass and is connected to electrical power supply by wires from the edges.

FIG. 8 shows an exemplary non-limiting electrical-thermal heating material (801) coated on glass (802) and is connected to electrical power supply (803) by wires (804) from the edges. Electrical-conducting/thermal-insulating (ECTI) materials may need to be high electrical conductors and poor heat conductors. Traditional electrical conductive composites are often highly heat conductive as well.

One exemplary non-limiting illustrative embodiment provides a multiple component composite system as an ECTI material. Preferably, a three component system can be used, with component A being at least one of thermoset, thermoplastic, or rubber polymer, with component B being a low melting point polymer or low molecule weight compound, and with component C being an electrically conductive filler that selectively enters into component B. Even more preferably, four component system can be used, with component A being at least one of thermoset, thermoplastic, or rubber polymer, with component B being a low melting point polymer or low molecular weight oligomer, with component C being the electrically conductive filler that selectively enters into component B, and with component D being a low thermal conductive filler that preferentially enters into component A. Even more preferably, the component D can be a nano sized spherical low thermal conductive filler to maximize the phonon reflecting interface. More preferably, the matrix can be a block co-polymer, which forms electrically conductive channels containing electrically conductive filler (component C) along the desired heat conducting direction.

One exemplary non-limiting illustrative embodiment provides a multiple component composite system comprising at least one matrix material that is one of thermoplastic, thermoset or rubber material, for use as an ECTI material. More preferably, the matrix material is capable of providing mechanical properties and physical properties based on the application requirements. Examples of matrix materials include, but are not limited to, silicone rubber, epoxy resin, phenolic resin, polyimide, unsaturated polyester, etc.

One exemplary non-limiting illustrative embodiment provides a multiple component composite system comprising at least one second phase polymer material, for use as an ECTI material. More preferably, the second phase polymer is immiscible with the matrix material. Examples of second phase polymers include, but are not limited to, polyethylene oxide for epoxy resin matrix, poly($\epsilon$-carprolactone) for silicon rubber, etc.

One exemplary non-limiting illustrative embodiment provides a multiple component composite system comprising at least one block copolymer matrix material, for use as an ECTI material. More preferably, the matrix can be a block copolymer with one block being the low melting point polymer. Examples include, but are not limited to, polydimethylsiloxane-b-ethylene oxide (PDMS-b-PEO), Poly(dimethylsiloxane-b-$\epsilon$-caprolactone) (PDMS-b-PCL), poly(urethane-b-dimethylsiloxane).

One exemplary non-limiting illustrative embodiment provides a multiple component composite system comprising at least one filler with low aspect ratio, for use as an ECTI material. Preferably, the fillers enter into the second phase material. More preferably, fillers with high electrical conductivity can be used. Examples of fillers include, but are not limited to, C, Ag, Au, Cu, Ni, Pt, Pd, Fe, Pb, Al, Zn, Co, Dy, Gd, etc. Even more preferably, nanoparticles can be used. Example of nanoparticles include, but are not limited to, carbon black nanoparticles, C60 fullerene, gold nanoparticles, silver nanoparticles, etc.

One exemplary non-limiting illustrative embodiment provides a multiple component composite system comprising at least one filler with high aspect ratio, for use as an ECTI material. Preferably, the fillers enter into the second phase material. More preferably, fillers with high electrical conductivity can be used. Examples of fillers include, but are not limited to, C, Ag, Au, Cu, Ni, Pt, Pd, Fe, Pb, Al, Zn, Co, Dy, Gd, etc. Even more preferably, nanowires and nanorods can be used. Examples include, but are not limited to carbon nanotubes, silver nanowires, gold nanorods, etc.

One exemplary non-limiting illustrative embodiment provides a multi-component composite system comprising electrically conductive fillers confined in low melting point second polymer phase and another type of fillers in the matrix polymer. Preferably, the fillers in the matrix material have low thermal conductivity. Examples of low thermal conductive fillers include, but are not limited to, $SiO_2$, $Al_2SiO_5$, $Al_2O_3$, etc. Even more preferably, the fillers can be well dispersed nanowires, nanoparticles, nanoflakes, and nanorods to maximize the phonon scattering interface. Examples includes but are not limited to, glass fibers, $SiO_2$ nanoparticles, $Al_2SiO_5$ nanoflakes, etc.

Example Non-Limiting Application as Underfill Materials

Figure 9:
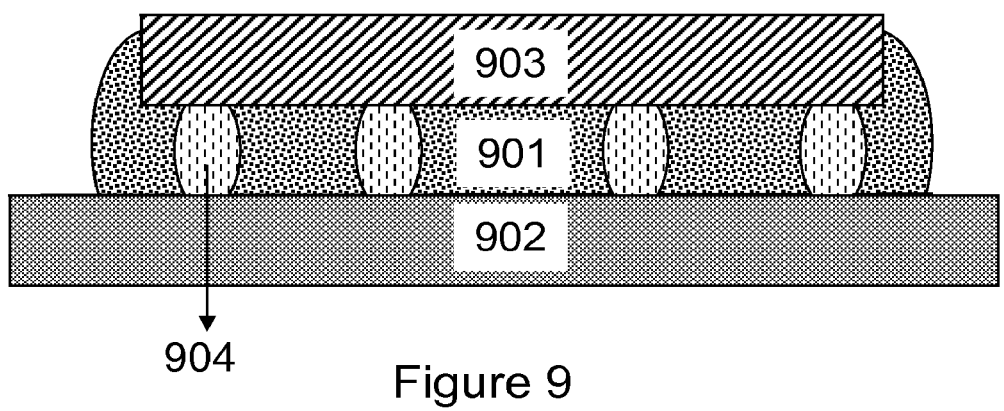
FIG. 9 shows an exemplary non-limiting example underfill material sandwiched between an IC chip and the underlying circuit board substrate.

FIG. 9 shows an exemplary underfill material (901) applied on to an IC circuit board substrate (902). The IC chip (903) is placed on top of the solder balls (904). Pressure is applied on the IC chip so that the solder balls deform at elevated operating temperature to form electrical connection between IC chip and IC circuit board substrate. The underfill material is squeezed out slightly and form a wrap around the IC chip. Finally, the underfill material solidifies to immobilize the IC chip. Traditional underfill materials are mostly micro-sized thermal conductive particle filled or unfilled adhesive polymers. Heat dissipation in the underfill is one of the major issues for IC packaging. Microsized particle filled underfill materials often suffer from inhomogeneous filler segregation and poor processability as a result of high viscosity.

One exemplary non-limiting illustrative embodiment provides a multiple component composite system as an underfill material. Preferably, a three component system can be used, with component A being at least one of thermoset, thermoplastic, or rubber polymer, with component B being a low melting point polymer or low molecule weight compound, and with component C being an electrically conductive filler that selectively enters into component B. More preferably, four component system can be used, with component A being at least one of thermoset, thermoplastic, or rubber polymer, with component B being a low melting point polymer or low molecular weight oligomer, with component C being the electrically conductive filler that selectively enters into component B, and with component D being a low thermal conductive filler that preferentially enters into component A. The component D can be a nano sized spherical low thermal conductive filler to maximize the phonon reflecting interface. The matrix can be a block co-polymer, which forms electrically conductive channels containing electrically conductive filler (component C) along the desired heat conducting direction.

One exemplary non-limiting illustrative embodiment provides a multiple component composite system comprising at least one matrix material that is one of thermoplastic, thermoset or rubber material, for use as an underfill material. More preferably, the matrix material is capable of providing mechanical properties and physical properties based on the application requirements. Examples of matrix materials include, but are not limited to, silicone rubber, epoxy resin, phenolic resin, polyimide, unsaturated polyester, etc.

One exemplary non-limiting illustrative embodiment provides a multiple component composite system comprising at least one second phase polymer material, for use as an underfill material. More preferably, the second phase polymer is immiscible with the matrix material. Examples of second phase polymers include, but are not limited to, polyethylene oxide for epoxy resin matrix, poly($\epsilon$-carprolactone) for silicon rubber, etc.

One exemplary non-limiting illustrative embodiment provides a multiple component composite system comprising at least one block copolymer matrix material, for use as an underfill material. More preferably, the matrix can be a block copolymer with one block being the low melting point polymer. Examples include, but are not limited to, polydimethylsiloxane-b-ethylene oxide (PDMS-b-PEO), Poly(dimethylsiloxane-b-$\epsilon$-caprolactone) (PDMS-b-PCL), poly(urethane-b-dimethylsiloxane).

One exemplary non-limiting illustrative embodiment provides a multiple component composite system comprising at least one filler with low aspect ratio, for use as an underfill material. Preferably, the fillers enter into the second phase material. More preferably, fillers with high electrical conductivity can be used. Examples of fillers include, but are not limited to, C, Ag, Au, Cu, Ni, Pt, Pd, Fe, Pb, Al, Zn, Co, Dy, Gd, etc. Even more preferably, nanoparticles can be used. Example of nanoparticles include, but are not limited to, carbon black nanoparticles, C60 fullerene, gold nanoparticles, silver nanoparticles, etc.

One exemplary non-limiting illustrative embodiment provides a multiple component composite system comprising at least one filler with high aspect ratio, for use as an underfill material. Preferably, the fillers enter into the second phase material. More preferably, fillers with high electrical conductivity can be used. Examples of fillers include, but are not limited to, C, Ag, Au, Cu, Ni, Pt, Pd, Fe, Pb, Al, Zn, Co, Dy, Gd, etc. Nanowires and nanorods can be used. Examples include, but are not limited to carbon nanotubes, silver nanowires, gold nanorods, etc.

One exemplary non-limiting illustrative embodiment provides a multi-component composite system comprising electrically conductive fillers confined in low melting point second polymer phase and another type of fillers in the matrix polymer. Preferably, the fillers in the matrix material have low thermal conductivity. Examples of low thermal conductive fillers include, but are not limited to, $SiO_2$, $Al_2SiO_5$, $Al_2O_3$, etc. More preferably, the fillers can be well dispersed nanowires, nanoparticles, nanoflakes, and nanorods to maximize the phonon scattering interface. Examples includes but are not limited to, glass fibers, $SiO_2$ nanoparticles, $Al_2SiO_5$ nanoflakes, etc.

While the technology herein has been described in connection with exemplary illustrative non-limiting implementations, the invention is not to be limited by the disclosure. The invention is intended to be defined by the claims and cover all corresponding and equivalent arrangements whether or not specifically disclosed herein.

We claim:

1. A process for assembling a system having enhanced thermal conductivity, comprising:
   providing an integrated circuit and a heat sink; and
   forming a multi-component thermal conductor therebetween, wherein the multi-component thermal conductor comprises a multicomponent material comprising:
   a first component comprising a polymer matrix, which is a first phase;
   a second component comprising a low melting point material immiscible with the first component; and
   a third component comprising a filler material with higher thermal conductivity than the first and second components;
   wherein the third component is dispersed into the second component to form a second phase, and the second phase is dispersed within the first phase,
   said second phase being segregated into domains within said first phase;

wherein said third component is percolated within the second phase; and wherein the second phase is percolated within the first phase.

2. The process of claim 1, wherein the multi-component thermal conductor further comprises a capped particle.

3. The process of claim 2, wherein the cap material is miscible with the second component, but not the first component.

4. The process according to claim 3, wherein the particle has a high aspect ratio.

5. The process according to claim 3, wherein the particle imparts improved thermal conductivity to the multi-component material.

6. The process according to claim 2, wherein the particle is nano-sized in at least one dimension.

7. The process according to claim 2, wherein the particle is not nano-sized in any dimension.

8. The process according to claim 2, wherein the particle is a semiconductor.

9. The process according to claim 2, wherein the particle is a metal.

10. The process according to claim 1, wherein the multi-component material has an intended application and the melting point of the second component is substantially at or below the expected operating temperature range of the intended application.

11. The process according to claim 1, wherein the multi-component material has an intended application and the melting point of the first component is substantially above the operating temperature range of the intended application.

12. The process according to claim 1, wherein the first component is an adhesive.

13. The process according to claim 1, wherein the first component is one of thermoset polymer, thermoplastic polymer, rubber polymer, block co-polymer or polymer blend.

14. The process according to claim 1, wherein the second component is a material selected from the group consisting of: poly(acrylonitrile-butadiene-styrene) (ABS), poly(methyl methacrylate) (PMMA), celluloid, cellulose acetate, poly(ethylene-vinyl acetate) (EVA), poly(ethylene vinyl alcohol) (EVOH), fluoroplastics, polyacrylates (Acrylic), polyacrylonitrile (PAN), polyamide (PA or Nylon), polyamide-imide (PAI), polyaryletherketone (PAEK), polybutadiene (PBD), polybutylene (PB), polybutylene terephthalate (PBT), polycaprolactone (PCL), polychlorotrifluoroethylene (PCTFE), polyethylene terephthalate (PET), polycyclohexylene dimethylene terephthalate (PCT), polycarbonate (PC), polyhydroxyalkanoates (PHAs), polyketone (PK), polyester, polyethylene (PE), polyetheretherketone (PEEK), polyetherketoneketone (PEKK), polyetherimide (PEI), polyethersulfone (PES), polyethylenechlorinates (PEC), polyimide (PI), polylactic acid (PLA), polymethylpentene (PMP), polyphenylene oxide (PPO), polyphenylene sulfide (PPS), polyphthalamide (PPA), polypropylene (PP), polystyrene (PS), polysulfone (PSU), polytrimethylene terephthalate (PTT), polyurethane (PU), polyvinyl acetate (PVA), polyvinyl chloride (PVC), polyvinylidene chloride (PVDC), and poly(styrene-acrylonitrile) (SAN).

15. The process according to claim 1, wherein the filler material is selected from the group consisting of: C, Ag, Au, Cu, Ni, Pt, Pd, Fe, Pb, Al, Zn, Co, Dy, Gd, ZnO, SiO2, BN, AlN, GaN, AlxGa1-xN, Al2O3, FeO, Fe2O3, Fe3O4, TiO2, MgO, EuO, and CrO2.

16. The process according to claim 1, wherein said filler material comprises particles having shapes in the form of spheres, clusters, rods, whiskers, flakes, and wires.

17. The process according to claim 1, further comprising:
a fourth component comprising a further filler material miscible in the first component and immiscible in the second component.

18. A process of making a multi-component material comprising:
a first component comprising a polymer matrix, which is a first phase;
a second component comprising a low melting point material immiscible with the first component; and
a third component comprising a filler material with higher thermal conductivity than the first and second components;
wherein the third component is dispersed into the second component to form a second phase, and the second phase is dispersed within the first phase,
said second phase being segregated into domains within said first phase;
wherein said third component is percolated within the second phase; and
wherein the second phase is percolated within the first phase, said process comprising: providing the first component and the second component; capping filler particles with capping agents immiscible with the polymeric matrix and miscible in the low melting point material to provide the filler material; dispersing the third component in the second component; creating a mixture by combining the first component and the second component, said second component containing the third component dispersed therein; and forming a multi-component material from the mixture.

19. The process according to claim 18, wherein the forming comprises coating a surface and heating the coating.

20. The process according to claim 19, wherein the coating comprises one of dipping, spinning, spraying, brushing, sputtering, painting, or printing.

21. The process according to claim 18, wherein the forming comprises heating and extruding the mixture.

22. The process according to claim 18, wherein the forming comprises heating and injection molding the mixture.

23. The process according to claim 18, wherein the forming comprises heating and compression molding the mixture.

24. The process according to claim 18, wherein the forming comprises heating and resin transfer molding the mixture.

25. The process according to claim 18, wherein the forming comprises heating and laminating the mixture.

26. A process of making a multi-component material comprising:
a first component comprising a polymer matrix, which is a first phase;
a second component comprising a low melting point material immiscible with the first component; and
a third component comprising a filler material with higher thermal conductivity than the first and second components;
wherein the third component is dispersed into the second component to form a second phase, and the second phase is dispersed within the first phase,
said second phase being segregated into domains within said first phase;
wherein said third component is percolated within the second phase; and
wherein the second phase is percolated within the first phase, said process, said material being a fluid for use in manufacturing thermally enhanced layers, said process comprising: providing the first component and the second component; capping filler particles with capping agents immiscible with the polymeric matrix and miscible in the low melting point material to provide the filler material; dispersing the third component in the second component; and creating a mixture by combining the first component and the second component, said second component containing the third component dispersed therein.

27. An integrated circuit and heat sink formed by the process of claim 1.

28. A process for assembling a system having enhanced thermal conductivity, comprising:
   providing an integrated circuit and a heat sink; and
   forming a multi-component thermal conductor therebetween,
   wherein the multi-component thermal conductor comprises a multicomponent material comprising:
   a polymer matrix;
   a low melting point material immiscible with the polymer matrix; and
   a filler material with higher thermal conductivity than the polymer matrix and the low melting point material;
   wherein the filler material is dispersed into the low melting point material and the low melting point material containing the filler material is dispersed within the polymer matrix, wherein said low melting point material containing the filler material is segregated into domains within the polymer matrix, said filler material is percolated within the dispersion of filler material within the low melting point material, and said low melting point material containing the filler material is percolated within the polymer matrix.

29. A process of making a multicomponent material comprising
   a polymer matrix;
   a first material immiscible with the polymer matrix; and
   a filler material with higher thermal conductivity than the polymer matrix and the first material;
   wherein the filler material is dispersed into the low melting point material and the low melting point material containing the filler material is dispersed within the polymer matrix, wherein said low melting point material containing the filler material is segregated into domains within the polymer matrix, said filler material is percolated within the dispersion of filler material within the low melting point material, and said low melting point material containing the filler material is percolated within the polymer matrix
   the process comprising: providing the first component and the second component; capping filler particles with capping agents immiscible with the polymeric matrix and miscible in the low melting point material to provide the filler material; dispersing the third component in the second component; creating a mixture by combining the first component and the second component, said second component containing the third component dispersed therein; and forming the multi-component material from the mixture.

30. The process according to claim 29, wherein the forming comprises coating a surface and heating the coating.

31. The process according to claim 30, wherein the coating comprises one of dipping, spinning, spraying, brushing, sputtering, painting, or printing.

32. The process according to claim 29, wherein the forming comprises heating and extruding the mixture.

33. The process according to claim 29, wherein the forming comprises heating and injection molding the mixture.

34. The process according to claim 29, wherein the forming comprises heating and compression molding the mixture.

35. The process according to claim 29, wherein the forming comprises heating and resin transfer molding the mixture.

36. The process according to claim 29, wherein the forming comprises heating and laminating the mixture.

* * * * *